(12) United States Patent　　(10) Patent No.:　　US 8,555,483 B2
Sato　　(45) Date of Patent:　　Oct. 15, 2013

(54) METHOD OF MANUFACTURING A VIBRATING ELEMENT

(75) Inventor: Takahiro Sato, Yokohama (JP)

(73) Assignee: Nikon Corporation, Tokyo (JP)

( * ) Notice: Subject to any disclaimer, the term of this patent is extended or adjusted under 35 U.S.C. 154(b) by 626 days.

(21) Appl. No.: 12/295,906

(22) PCT Filed: Mar. 30, 2007

(86) PCT No.: PCT/JP2007/057263
§ 371 (c)(1),
(2), (4) Date: Mar. 25, 2009

(87) PCT Pub. No.: WO2007/114385
PCT Pub. Date: Oct. 11, 2007

(65) Prior Publication Data
US 2009/0237818 A1　　Sep. 24, 2009

(30) Foreign Application Priority Data

Apr. 4, 2006　(JP) ................................. 2006-102716

(51) Int. Cl.
*H04R 31/00*　　(2006.01)

(52) U.S. Cl.
USPC ............. 29/594; 29/25.35; 29/595; 29/609.1; 181/171; 181/172; 156/89.11; 156/89.12; 156/250; 367/171; 367/181; 367/140; 367/141; 381/173; 381/174; 381/175; 381/369

(58) Field of Classification Search
USPC .................. 29/25.35, 592.1, 594, 595, 609.1; 181/171, 172; 156/89.11, 89.12, 250; 367/171, 181, 140, 141; 381/173–175, 381/348, 369, 396, 398
See application file for complete search history.

(56) References Cited

U.S. PATENT DOCUMENTS

| 5,322,580 | A | * | 6/1994 | McIntire et al. ............... 156/148 |
| 5,485,249 | A | * | 1/1996 | Higeta et al. .................. 399/105 |
| 5,508,581 | A | * | 4/1996 | Saya et al. ................ 310/323.11 |
| 5,955,819 | A | * | 9/1999 | Takano et al. ............ 310/316.01 |

FOREIGN PATENT DOCUMENTS

| JM | 08-196091 | | 7/1996 |
| JP | 63-209477 | | 8/1988 |
| JP | 01-107677 | | 4/1989 |
| JP | 07-241091 | | 9/1995 |
| JP | 09223825 | A * | 8/1997 |

OTHER PUBLICATIONS

Japanese Office Action for corresponding JP Application No. 2008-508685, Jul. 3, 2012.

* cited by examiner

*Primary Examiner* — Paul D Kim
(74) *Attorney, Agent, or Firm* — Ditthavong Mori & Steiner, P.C.

(57) ABSTRACT

A vibrating element manufacturing method by which adhesion is stabilized and yield is improved, a vibrating element, a vibrating actuator, a lens barrel and a camera system. A vibrating element manufacturing method is provided with a first step of arranging an elastic body on a holding member, a second step of forming an electromechanical transducing element by injection molding on the surface of the elastic body, and a third step of sintering the electromechanical transducing element by heating and bonding the elastic body with the electromechanical transducer element.

10 Claims, 16 Drawing Sheets

US 8,555,483 B2

METHOD OF MANUFACTURING A VIBRATING ELEMENT

CROSS REFERENCE TO RELATED APPLICATION

The present application claims priority to PCT Application No. PCT/JP2007/057263, filed on Mar. 30, 2007, which claims priority to Japanese Patent Application No. 2006-102716, filed on Apr. 4, 2006. The entire contents of these applications are herein incorporated by reference.

TECHNICAL FIELD

The present invention relates to a vibrating element manufacturing method, a vibrating element, a vibrating actuator, a lens barrel and a camera system.

BACKGROUND ART

Patent Document 1 discloses an ultrasonic actuator in which the raw material of a vibrating element is fabricated of a sintered alloy, and the ultrasonic actuator withstands usage in adverse environments with high temperature and high humidity, driving over long periods and the like.

However, both in this kind of ultrasonic actuator and in ordinary ultrasonic motors, a elastic body and a piezoelectric element are fixed together by adhesion. Adhesion of the elastic body to the piezoelectric element is a very important stage for the functioning of a motor. If the state of adhesion is not stable, functions of the motor are not stable, and reliability over long periods cannot be assured. In addition, issues that must be controlled to stabilize the state of adhesion are manifold: control of the amount of adhesive, control of curing conditions, and so forth. If even one of these is not stable, this will have an effect on functions of the motor.

In addition, steps of processing of a piezoelectric element to be used in an ultrasonic motor are very diverse, and because sintering steps and mechanical processing are difficult, a yield is not very good. Moreover, as mentioned above, the elastic body and the piezoelectric element are fixed by adhesion. However, because of inconsistencies in mechanical processing of piezoelectric elements, when the elastic body and the piezoelectric element are adhered, the center of the elastic body and the center of the piezoelectric element may be misaligned. If the outer diameter of the piezoelectric element protrudes outward beyond the outer diameter of the elastic body, that portion must be ground away. Hence, cracks may occur in subsequent steps, and the yield at the time of assembly may be lower.

Patent Document 1: Japanese Unexamined Patent Publication No. H8-196091

DISCLOSURE OF THE INVENTION

Problems to be Solved by the Invention

An object of the present invention is to provide a vibrating element manufacturing method, a vibrating element, a vibrating actuator, a lens barrel and a camera system capable of stabilizing adhesion characteristics and capable of improving the yield.

Means for Solving the Problems

The present invention solves the above-described problem with the following solution. Here, for ease of understanding, descriptions are provided with reference numerals according to embodiments of the present invention assigned; however, these are not to be limiting.

An invention according to claim 1 is a vibrating element manufacturing method including: a first step (S201) of disposing a elastic body (12) in a retaining member (12A); a second step (S203) of forming an electro-mechanical conversion element (13) at a surface of the elastic body (12) by injection molding; and a third step (S205) of heating and sintering the electro-mechanical conversion element (13) and bonding the elastic body (12) with the electro-mechanical conversion element (13).

An invention according to claim 2 is a vibrating element manufacturing method including: a first step (S101) of disposing an electro-mechanical conversion element (13) in a retaining member (13A); a second step (S103) of forming a elastic body (12) at a surface of the electro-mechanical conversion element (13) by injection molding; and a third step (S105) of heating and sintering the elastic body (12) and bonding the elastic body (12) with the electro-mechanical conversion element (13).

The invention according to claim 3 is a vibrating element manufacturing method according to claim 1 or claim 2, including, between the second step (S103, S203) and the third step (S105, S205), a step (S104, S204) of pressurizing the elastic body (12) and the electro-mechanical conversion element (13).

An invention according to claim 4 is a vibrating element manufacturing method including: a first step (S201) of disposing a elastic body (12) in a first die (12A); a second step (S202) of disposing a second die (13A) at the first die (12A); a third step (S203) of injecting a powder material (131) into the second die (13A) and forming an electro-mechanical conversion element (13) at a surface of the elastic body (12); and a fourth step (S205) of removing the elastic body (12) and the electro-mechanical conversion element (13) from the first die (12A) and the second die (13A), and heating and sintering the electro-mechanical conversion element (13) and bonding the elastic body (12) with the electro-mechanical conversion element (13).

An invention according to claim 5 is a vibrating element manufacturing method including: a first step (S101) of disposing an electro-mechanical conversion element (13) in a first die (13A); a second step (S102) of disposing a second die (12A) at the first die (13A); a third step (S103) of injecting a powder material (121) into the second die (12A) and forming a elastic body (12) at a surface of the electro-mechanical conversion element (13); and a fourth step (S105) of removing the elastic body (12) and the electro-mechanical conversion element (13) from the first die (13A) and the second die (12A), and heating and sintering the elastic body (12) and bonding the elastic body (12) with the electro-mechanical conversion element (13).

The invention according to claim 6 is a vibrating element manufacturing method according to claim 4 or claim 5, including, between the third step (S103, S203) and the fourth step (S105, S205), a step of applying pressure force between the first die (12A) and the second die (13A) so as to pressurize the elastic body (12) and the electro-mechanical conversion element (13).

An invention according to claim 7 is a vibrating element manufacturing method including: a first step (S501) of forming a elastic body (12) in a retaining member (12A) by injection molding; a second step (S502) of disposing an electro-mechanical conversion element (13) at a surface of the elastic body (12); a third step (S503) of pressurizing the elastic body (12) and the electro-mechanical conversion element (13); and a fourth step (S504) of heating and sintering the elastic body (12) and bonding the elastic body (12) with the electro-mechanical conversion element (13).

An invention according to claim 8 is a vibrating element manufacturing method including: a first step (S601) of forming an electro-mechanical conversion element (13) in a retaining member (13A) by injection molding; a second step (S602) of disposing a elastic body (12) at a surface of the electro-mechanical conversion element (13); a third step (S603) of pressurizing the elastic body (12) and the electro-mechanical conversion element (13); and a fourth step (S604) of heating and sintering the electro-mechanical conversion element (13) and bonding the elastic body (12) with the electro-mechanical conversion element (13).

An invention according to claim 9 is a vibrating element manufacturing method including: a first step (S501) of injecting a powder material (121) into a first die (12A) and forming a elastic body (12); a second step (S502) of removing a portion (12A-1) of the first die (12A) and disposing a second die (13A), in which an electro-mechanical conversion element (13) is disposed, at a surface of the elastic body (12) in the first die (12A); a third step (S503) of applying pressure force between the first die (12A) and the second die (13A) so as to pressurize the elastic body (12) and the electro-mechanical conversion element (13); and a fourth step (S504) of removing the elastic body (12) and the electro-mechanical conversion element (13) from the first die (12A) and the second die (13A), and heating and sintering the elastic body (12) and bonding the elastic body (12) with the electro-mechanical conversion element (13).

An invention according to claim 10 is a vibrating element manufacturing method including: a first step (S601) of injecting a powder material (131) into a first die (13A) and forming an electro-mechanical conversion element (13); a second step (S602) of removing a portion (13A-1) of the first die (13A) and disposing a second die (12A), in which a elastic body (12) is disposed, at a surface of the electro-mechanical conversion element (13) in the first die (13A); a third step (S603) of applying pressure force between the first die (13A) and the second die (12A) so as to pressurize the elastic body (12) and the electro-mechanical conversion element (13); and a fourth step (S604) of removing the elastic body (12) and the electro-mechanical conversion element (13) from the first die (13A) and the second die (12A), and heating and sintering the electro-mechanical conversion element (13) and bonding the elastic body (12) with the electro-mechanical conversion element (13).

An invention according to claim 11 is a vibrating element manufacturing method including: a first step (S301) of forming a elastic body (12) in a retaining member (12A) by injection molding; a second step (S303) of forming an electro-mechanical conversion element (13) at a surface of the elastic body (12) by injection molding; and a third step (S305) of heating and sintering the elastic body (12) and the electro-mechanical conversion element (13) and bonding the elastic body (12) with the electro-mechanical conversion element (13).

An invention according to claim 12 is a vibrating element manufacturing method including: a first step (S401) of forming an electro-mechanical conversion element (13) in a retaining member (13A) by injection molding; a second step (S403) of forming a elastic body (12) at a surface of the electro-mechanical conversion element (13) by injection molding; and a third step (S405) of heating and sintering the elastic body (12) and the electro-mechanical conversion element (13) and bonding the elastic body (12) with the electro-mechanical conversion element (13).

The invention according to claim 13 is a vibrating element manufacturing method according to claim 11 or claim 12, including, between the second step (S303, 403) and the third step (S305, S405), a step (S304, S404) of pressurizing the elastic body (12) and the electro-mechanical conversion element (13).

An invention according to claim 14 is a vibrating element manufacturing method including: a first step (S301) of injecting a powder material (121) into a first die (12A) and forming a elastic body (12); a second step (S302) of removing a portion (12A-1) of the first die (12A) and disposing a second die (13A) at the first die (12A); a third step (S303) of injecting a powder material (131) into the second die (13A) and forming an electro-mechanical conversion element (13) at a surface of the elastic body (12); and a fourth step (S305) of removing the elastic body (12) and the electro-mechanical conversion element (13) from the first die (12A) and the second die (13A), and heating and sintering the elastic body (12) and the electro-mechanical conversion element (13) and bonding the elastic body (12) with the electro-mechanical conversion element (13).

An invention according to claim 15 is a vibrating element manufacturing method including: a first step (S401) of injecting a powder material (131) into a first die (13A) and forming an electro-mechanical conversion element (13); a second step (S402) of removing a portion (13A-1) of the first die (13A) and disposing a second die (12A) at the first die (13A); a third step (S403) of injecting a powder material (121) into the second die (12A) and forming a elastic body (12) at a surface of the electro-mechanical conversion element (13); and a fourth step (S405) of removing the elastic body (12) and the electro-mechanical conversion element (13) from the first die (13A) and the second die (12A), and heating and sintering the elastic body (12) and the electro-mechanical conversion element (13) and bonding the elastic body (12) with the electro-mechanical conversion element (13).

The invention according to claim 16 is a vibrating element manufacturing method according to claim 14 or claim 15, including, between the third step (S303, S403) and the fourth step (S305, S405), a step (S304, S403) of applying pressure force between the first die (12A) and the second die (13A) so as to pressurize the elastic body (12) and the electro-mechanical conversion element (13).

An invention according to claim 17 is a vibrating element manufacturing method for manufacturing a vibrating element (11) having a elastic body (12) and an electro-mechanical conversion element (13), in which the method includes: a retention step (#300) of integrating and retaining the elastic body (12) and the electro-mechanical conversion element (13); and a thermal sintering step (#401) of heating and sintering the elastic body (12) and the electro-mechanical conversion element (13) retained in the retention step (#300).

The invention according to claim 18 is a vibrating element manufacturing method according to claim 17, including a molding step (#204, #504, #704 #804) of molding at least one of the elastic body (12) and the electro-mechanical conversion element (13).

The invention according to claim 19 is a vibrating element manufacturing method according to claim 17, including a combteeth formation step of forming combteeth at the elastic body (12).

The invention according to claim 20 is a vibrating element manufacturing method according to any one of claims 17 to 19, including a reinforcement application step of applying a reinforcement (19) that strengthens a bonding force between the elastic body (12) and the electro-mechanical conversion element (13).

The invention according to claim 21 is a vibrating element manufacturing method according to any one of claims 17 to 20, in which a sintering temperature of the thermal sintering step (#401) is 1000-1200° C.

The invention according to claim 22 is a vibrating element manufacturing method according to any one of claims 17 to 21, including an electrode formation step (#402) of forming an electrode at the electro-mechanical conversion element (13).

The invention according to claim 23 is a vibrating element manufacturing method according to 17 to 22, including a polarization step (#403) of polarizing the electro-mechanical conversion element (13).

An invention according to claim 24 is a vibrating actuator (10) including: a vibrating element (11) manufactured by the vibrating element manufacturing method according to any one of claims 1 to 23; and a relative motion member (14) that is driven by the vibrating element (11).

An invention according to claim 25 is a lens barrel (3) including the vibrating actuator (10) according to claim 24.

An invention according to claim 26 is a camera system (1) including the vibrating actuator (10) according to claim 24.

Furthermore, the constitutions to which the reference numerals are assigned may be suitably modified, and at least portions thereof may be substituted with other constituents.

Effects of the Invention

According to the present invention, a vibrating element manufacturing method, a vibrating element, a vibrating actuator, a lens barrel and a camera system capable of stabilizing adhesion characteristics and capable of improving the yield, can be provided.

PREFERRED MODE FOR CARRYING OUT THE INVENTION

Hereinafter, preferred embodiments of the present invention are described in more detail with reference to the drawings and the like. In the following preferred embodiments, six embodiments are described. The differences between the embodiments are in what materials (a elastic body and a piezoelectric element) are injected at which times. The first and second embodiments follow a pattern of injection onto a pre-existing item, the third and fourth embodiments follow a pattern of injection onto an injected item, and the fifth and sixth embodiments follow a pattern of disposing a pre-existing item on an injected item.

First Embodiment

Figure 1:
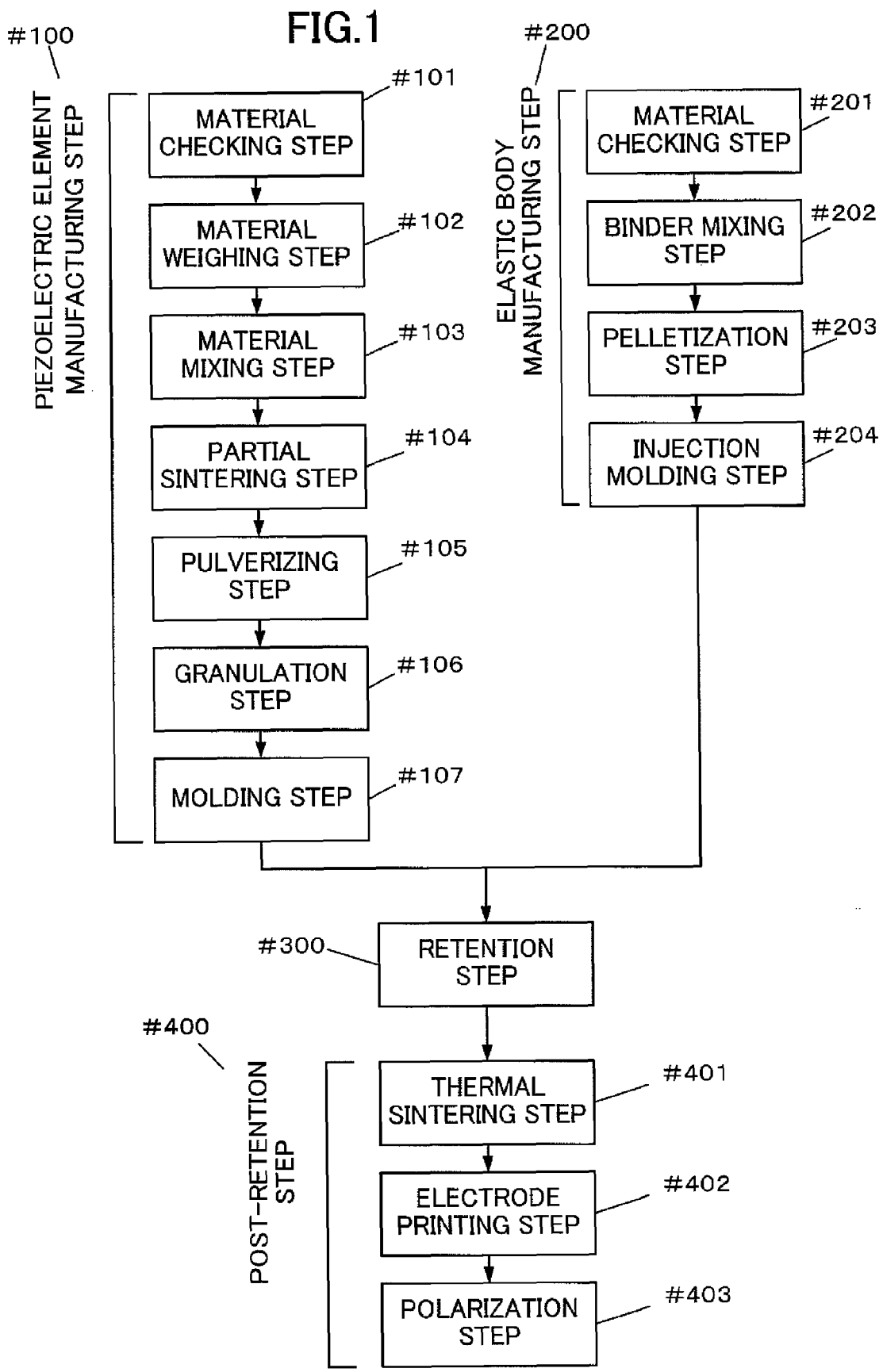
FIG. 1 is a process diagram showing a vibrating element manufacturing method according to a first embodiment.
Figure 2:
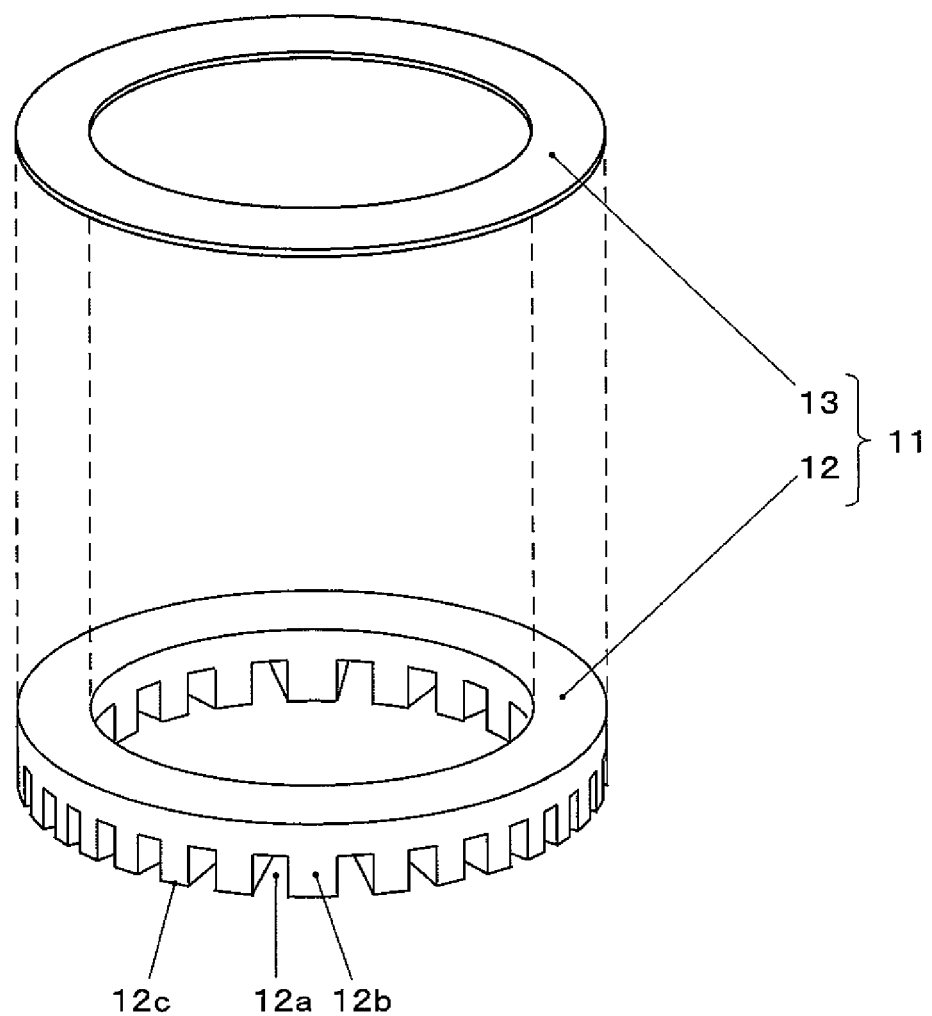
FIG. 2 is a diagram showing a vibrating element manufactured by the vibrating element manufacturing method according to the first embodiment.
Figure 8:
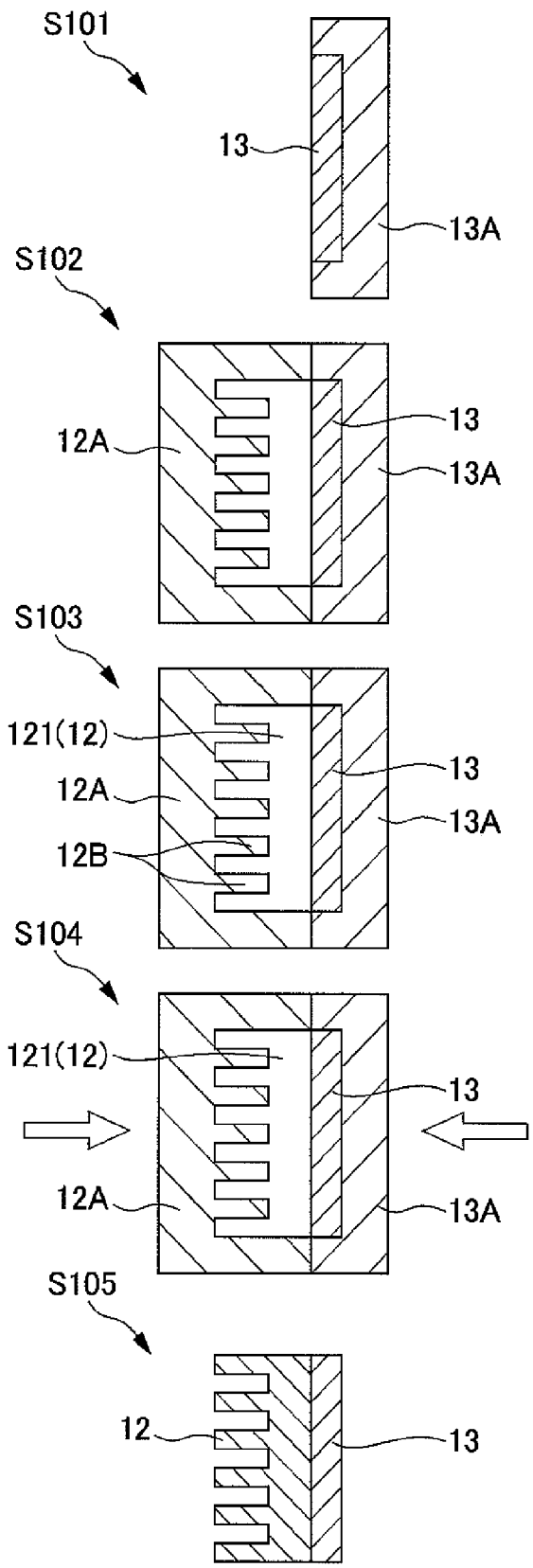
FIG. 8 is a schematic diagram showing the vibrating element manufacturing method according to the first embodiment.

FIG. 1 is a process diagram showing the vibrating element manufacturing method according to the first embodiment, FIG. 2 is a diagram showing the vibrating element manufactured by the vibrating element manufacturing method according to the first embodiment, and FIG. 8 is a schematic diagram showing the vibrating element manufacturing method according to the first embodiment.

The first embodiment of the manufacturing method is a manufacturing method that manufactures a vibrating element 11 provided with a elastic body 12 and a piezoelectric element 13, and is provided with a piezoelectric element manufacturing step #100, a elastic body manufacturing step #200, a retention step #300 and a post-retention step #400.

First, the vibrating element 11 that is fabricated by the first embodiment of the manufacturing method is described with reference to FIG. 2.

The vibrating element 11 is provided with the elastic body 12 and the piezoelectric element 13.

The elastic body 12 is a resiliently deformable metallic material, and the shape thereof is an annular shape. Comb-teeth-form grooves 12a are formed at a face of the elastic body 12 at an opposite side thereof from a side to which the piezoelectric element 13 is joined. Distal end faces of protrusion portions 12b (locations at which the grooves 12a are not formed) form a driving surface 12c. When this vibrating element 11 is assembled into a vibrating actuator, the driving surface 12c is pressed to contact against the vibrating element. A reason for forming the grooves 12a is to amplify the amplitudes of progressive waves that occur at the driving surface 12c. The elastic body 12 is formed of, for example, SUS steel, brass or the like.

The piezoelectric element 13 is bonded to the face of the elastic body 12 at the opposite side thereof from the grooves 12a, and is an electro-mechanical conversion element that converts electrical energy to mechanical energy. The piezoelectric element 13 is excited by a driving signal of AC voltage or the like, causing vibrations to occur in the elastic body 12, and causing progressive waves to occur at the driving surface 12c. The piezoelectric element 13 is formed of, for example, PZT (lead zirconate titanate), a ceramic or the like. Furthermore, the piezoelectric element 13 may instead be an electrostrictive element, a magnetostrictive element or the like.

Next, the vibrating element manufacturing method according to the first embodiment is described.

As shown in FIG. 1, the piezoelectric element manufacturing step #100 is provided with a material checking step #101, a material weighing step #102, a material mixing step #103, a partial sintering step #104, a pulverizing step #105, a granulation step #106 and a molding step #107. In the present embodiment, PZT is used as the material of the piezoelectric element 13.

The material checking step #101 is a step of checking materials of the PZT. For example, it is checked that the purity of the PZT is at least 99.90% using a fluorescent X-ray device.

The material weighing step #102 is a step of measuring the weight of the PZT raw material. For example, it is checked that the weight of the PZT raw material is no more than 0.1 g different from a predetermined target value, using a precision balance.

The material mixing step #103 is a step of mixing the PZT raw material with a predetermined material required for sintering. For example, mixing is conducted for a predetermined duration using a ball mill. Then, it is checked that the particle diameter of the mixture is 1 to 2 μm, using a particle size distribution instrument.

The partial sintering step #104 is a step of partially sintering the mixture. For example, partial sintering is conducted while confirming that a temperature profile (specification) is within a range of 850° C.±5° C. using a temperature recording instrument or a temperature history sensor.

The pulverizing step #105 is a step of pulverizing the product of the partial sintering. For example, pulverization is conducted for a predetermined duration using a ball mill. Then, particle diameter of the product of the pulverization is confirmed to be 1-2 μm, using a particle size distribution instrument. The proportion of PZT is checked from the PZT crystalline phase, using an X-ray analyzer, and the relative surface area thereof is confirmed to be a predetermined value.

The granulation step #106 is a step of compacting the pulverized powder and forming grains. For example, the powder is dried using a spray dryer, PVA (polyvinyl alcohol) is added to serve as a binder, and granulation is performed. At this time, the diameter of the granulated grains is confirmed to be a predetermined value, using an SEM (electron microscope). Furthermore, the temperature of the spray dryer being a predetermined value and the PVA constituting a predetermined proportion are confirmed.

The molding step #107 is a step of forming a granulated green body. For example, press-molding is performed using a press while checking that the pressure value is 1 t/cm$^2$.

Herein, a pre-existing item may be used as the piezoelectric element 13.

Then, the piezoelectric element 13 that has been fabricated in this manner is disposed in a piezoelectric element die 13A (see FIG. 8, S101).

Next, a elastic body die 12A is disposed at the piezoelectric element die 13A (see FIG. 8, S102).

As shown in FIG. 1, the elastic body manufacturing step #200 is a step of manufacturing the elastic body 12 by a metal injection molding process, in which a metallic powder is injection-molded and sintered, and is provided with a material checking step #201, a binder mixing step #202, a pelletization step #203 and an injection molding step #204. Furthermore, in the present embodiment, SUS304 is used as the material of the elastic body 12.

The material checking step #201 is a step of checking materials of the SUS. For example, the average grain diameter of the SUS is confirmed to be approximately 5 μm, using a particle size distribution instrument.

The binder mixing step #202 is a step of mixing the SUS raw material powder with a resin binder. For example, it is confirmed that the total weight of the mixture is no more than 1 g different from a predetermined target value, using a precision balance.

The pelletization step #203 is a step of pelletizing (compacting into grains) the mixture. This is performed using, for example, a pelleting machine.

The injection molding step #204 is a step of injection-molding the pelletized mixture. This is performed using, for example, an injection molding press while confirming that the temperature is 160 to 170° C., that the dwell pressure is a predetermined value, that the dwell time is a predetermined value and the like. In this injection molding, a die is used and the piezoelectric element 13 manufactured by the process described above is disposed in this die in advance (see FIG. 8, S101 and S102). A pelletized mixture (powder material) 121 (12) is injection-molded onto the piezoelectric element 13, and the elastic body 12 and piezoelectric element 13 are made to be integral (see FIG. 8, S103). A shape 12B corresponding to the combteeth is provided in the elastic body die 12A that is used, and the combtooth shapes are formed by the injection molding. There is also a degreasing step after the injection molding step #204, to remove unneeded resin binder. The degreasing is performed by, for example, a pyrolysis process or the like.

As shown in FIG. 1, the retention step #300 is a step of integrally retaining the elastic body 12 and the piezoelectric element 13. In this step, pressure force is applied between the elastic body die 12A and the piezoelectric element die 13A so as to pressurize the elastic body 12 and the piezoelectric element 13 (see FIG. 8, S104). The pressure value is preferably of the order 0.5 t/cm$^2$. Furthermore, at the time of injection, if the elastic body 12 and the piezoelectric element 13 are sufficiently pressurized (if the pressure value is around 0.5 t/cm$^2$), the partial sintering step #104 may be combined with this step. Thus, this step may be omitted.

The post-retention step #400 is provided with a thermal sintering step #401, an electrode printing step #402 and a polarization step #403.

The thermal sintering step #401 is a step of heating and sintering the elastic body 12 and piezoelectric element 13 that have been retained by the retention step #300. The sintering temperature in the thermal sintering step is preferably 1000 to 1200° C. More specifically, the elastic body 12 and the piezoelectric element 13 are removed from the elastic body die 12A and the piezoelectric element die 13A, the elastic body 12 is heated and sintered, and the elastic body 12 and piezoelectric element 13 are bonded (see FIG. 8, S105). The thermal sintering step #401 is performed while confirming, for example, that the temperature profile is within a range of 1100° C.±10° C. using a temperature recording instrument or a temperature history sensor. Furthermore, it is confirmed that the sintered density is a predetermined value, using a precision balance, and that the crystal grain diameter is a predetermined value (approx. 2 μm), using an SEM. By this thermal sintering step #401, the elastic body formed of the mixture becomes the elastic body 12 in the form of a sintered body, and is perfectly bonded with the piezoelectric element 13.

The electrode printing step #402 is a step of printing electrodes on the piezoelectric element 13. For example, the electrodes are printed using a screen printer. Then, the thickness of the electrodes is confirmed to be 2 to 5 μm using an SEM.

The polarization step #403 is a step of polarizing the piezoelectric element 13. For example, the voltage is set, using a predetermined power supply, to 25 kV/cm$^2$. The temperature is set to 100° C., using a thermometer, and the voltage is applied for 30 minutes using a timer. The polarization must be performed by sandwiching the piezoelectric element 13 between a positive electrode and a negative electrode. The printed electrodes are used for one electrode and the elastic body 12 is used for the other electrode.

Thus, according to the first embodiment of the manufacturing method, the elastic body 12 is fabricated by a metal injection molding process, is integrated with the piezoelectric element 13 during the injection molding, and is perfectly bonded with the piezoelectric element 13 during the thermal sintering. Thus, the conventional adhesion step can be eliminated, and a great reduction in assembly time and a stabilization of product quality may be achieved.

Moreover, because the combteeth of the elastic body 12 are formed using the die, mechanical processing is unnecessary and the yield is improved. Furthermore, because the combteeth are formed in a joining step (in the injection molding step #204), a great reduction in the number of manufacturing stages is possible.

In addition, among control issues in the metal injection molding process, the following must be controlled: (1) the mixing ratio of the raw material with the resin binder; (2) the mixing duration; (3) the injection pressure; (4) the dwell time; (5) the degreasing temperature and duration; (6) the sintering temperature and duration; and the like. These conditions are applied in an ordinary plastic molding process and may be dealt with by the same controls. Therefore, in comparison with the conventional adhesion step, control issues may be simplified.

In contrast, for a conventional vibrating element, the step of adhering the elastic body to the piezoelectric element includes steps of: (1) component washing and drying, (2) adhesive application, (3) mounting in a fixing jig, (4) thermal curing, (5) removal from the fixing jig, and the like.

In the above steps, the issues that must be controlled are: (1) an application amount of the adhesive, (2) temperature of the adhesive, (3) pressing force, (4) pressing duration, (5) curing temperature, (6) curing duration, and the like.

Furthermore, while the control issues in these steps are as detailed above, manifold controls are required in addition to these control issues, such as (1) the storage temperature of the adhesive, (2) the storage lifetime of the adhesive, and (3) maintenance of the jig.

On the other hand, with the first embodiment of the manufacturing method, because the elastic body and the piezoelectric element that have been integrated by the metal injection molding process are perfectly bonded by the thermal sintering, these manifold control issues may be eliminated.

Figure 3:
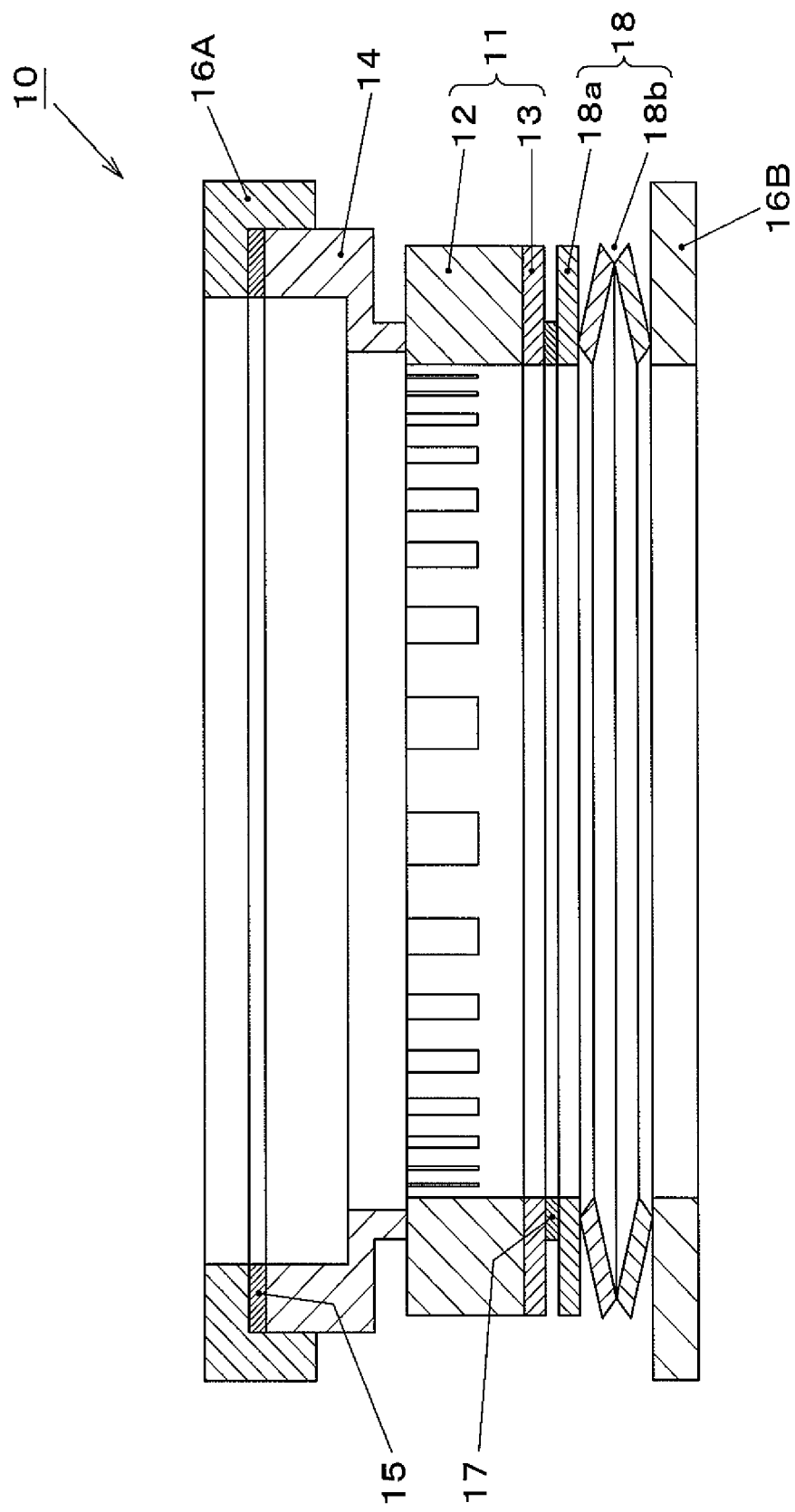
FIG. 3 is a diagram showing an ultrasonic motor according to the first embodiment.

FIG. 3 is a diagram showing an ultrasonic motor according to the first embodiment. In the embodiments described hereinafter, an ultrasonic motor that utilizes ultrasonic vibrations is provided as an example of a vibrating actuator and described.

An ultrasonic motor 10 is provided with the vibrating element 11, a moving body 14, a buffer member 15, supports 16A and 16B, a buffer member 17, a pressure portion 18, and the like.

The vibrating element 11 is manufactured by the manufacturing method described above and is provided with the elastic body 12 and the piezoelectric element 13.

The moving body 14 has a substantially annular shape, is pressed against the elastic body 12 by the pressure portion 18, which is described later, and is a member that is frictionally driven by progressive waves generated at the driving face of the elastic body 12 of the vibrating element 11.

The buffer member 15 is formed of rubber or the like in a substantially annular shape, is a member formed so as not to transmit vibrations of the moving body 14 toward the support 16A, and is provided between the moving body 14 and the support 16A.

The support 16A is a member that supports the moving body 14. The support 16A and the moving body 14 are joined by a joining member not shown so as to rotate integrally, and are a member that transmits rotary movements of the moving body 14 to a driven member not shown.

The pressure portion 18 is a member that causes the vibrating element 11 and the moving body 14 to press together to contact, and is provided with a pressure plate 18a and a plate spring 18b or the like. The pressure plate 18a is a plate that receives pressure force generated by the plate spring 18b.

The buffer member 17 is formed of nonwoven cloth, felt or the like, is a member formed so as to transmit vibrations of the vibrating element 11 to the pressure portion 18, and is provided between the piezoelectric element 13 and the pressure plate 18a.

The support 16B is a member that fixes the ultrasonic motor 10 to, for example, a lens barrel of a camera or the like.

Thus, according to the ultrasonic motor 10 of the first embodiment, because the vibrating element 11 with stability is provided, motor characteristics are stable and long-term reliability can be assured.

Figure 4:
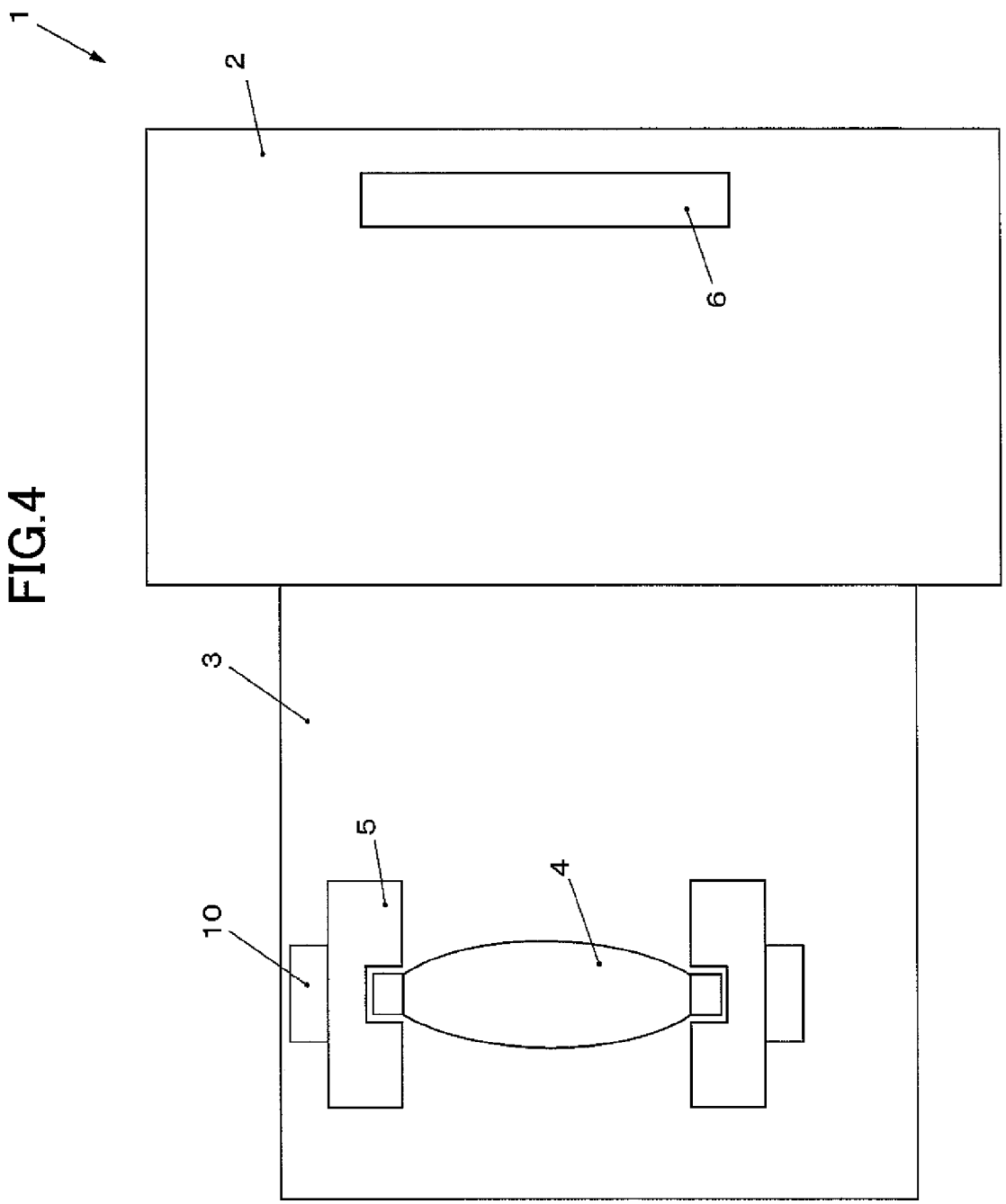
FIG. 4 is a diagram showing a camera system according to the first embodiment.

FIG. 4 is a diagram showing a camera system according to the first embodiment.

A camera system 1 of the first embodiment is provided with a camera body 2, including an imaging device 6, and a lens barrel 3. The lens barrel 3 is an interchangeable lens which is detachable from the camera body 2. In the camera system 1 of the present embodiment, the lens barrel 3 illustrates an example that is an interchangeable lens, but this is not to be limiting; for example, it may be a lens barrel of a type that is integral with the camera body.

The lens barrel 3 is provided with a lens 4, a cam tube 5, the above-described ultrasonic motor 10, and the like. In the present embodiment, the ultrasonic motor 10 is used as a drive source that drives the lens 4 when focus-driving the camera system 1. The driving force provided from the ultrasonic motor 10 is transmitted to the cam tube 5. The lens 4 is cam-engaged with the cam tube 5. When the cam tube 5 is turned by driving of the ultrasonic motor 10, the lens 4 moves in the optical axis direction, by cam-engagement with the cam tube 5, and implements focus point adjustment.

Thus, according to the camera system 1 of the first embodiment, because the ultrasonic motor 10 that has stable motor characteristics and can assure long-term reliability is provided, a camera system that is superior in functionality and endurance can be provided.

Second Embodiment

Figure 5:
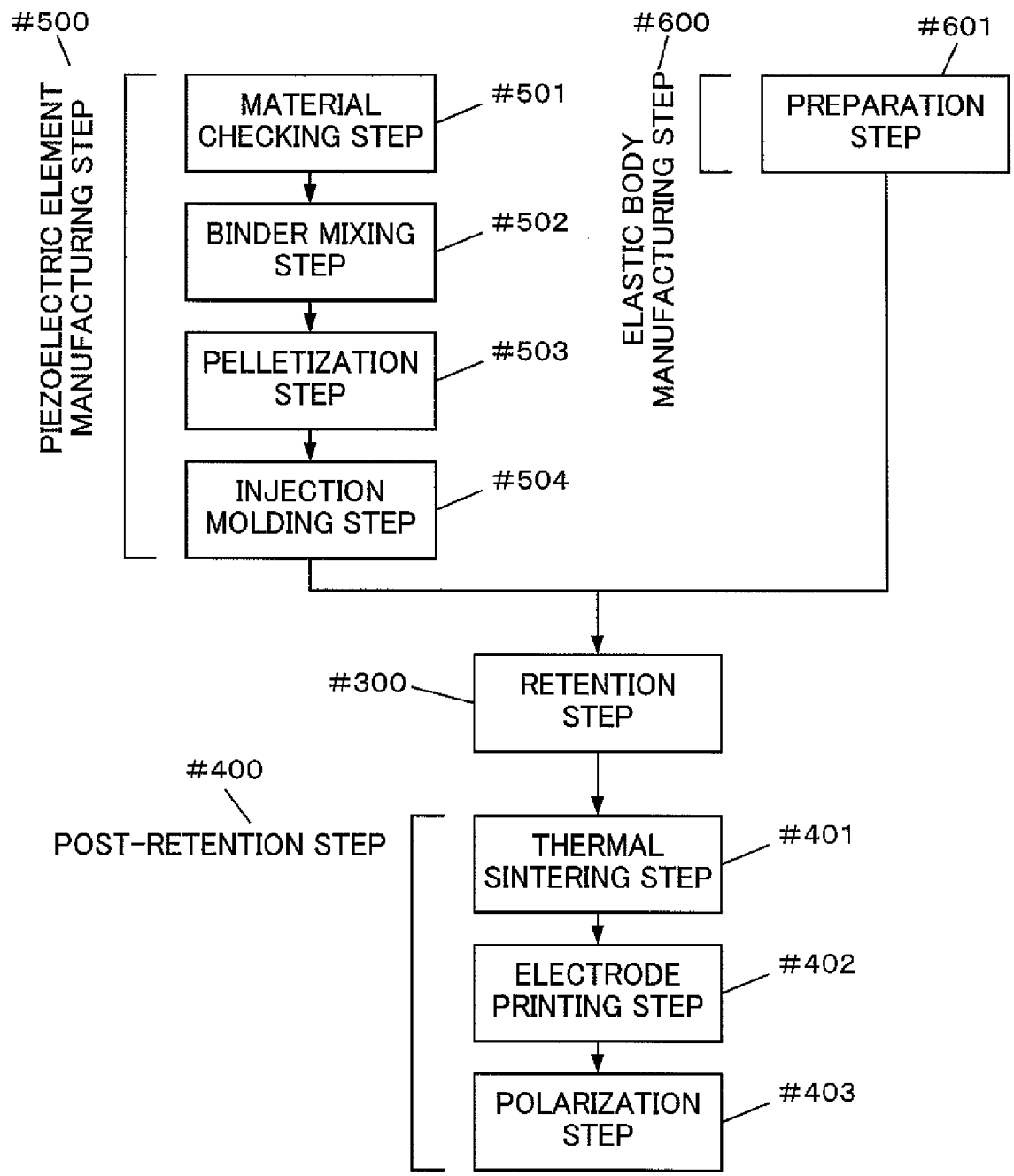
FIG. 5 is a process diagram showing the vibrating element manufacturing method according to a second embodiment.
Figure 9:
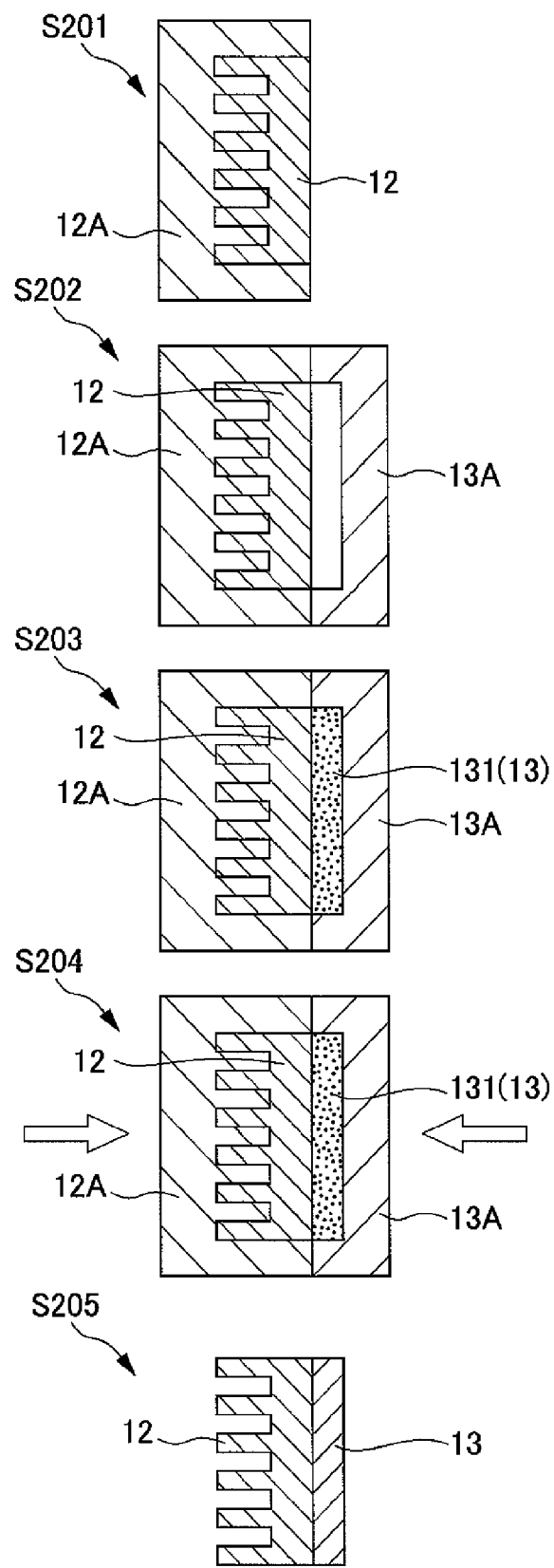
FIG. 9 is a schematic diagram showing the vibrating element manufacturing method according to the second embodiment.

FIG. 5 is a process diagram showing the vibrating element manufacturing method according to a second embodiment, and FIG. 9 is a schematic diagram showing the vibrating element manufacturing method according to the second embodiment.

Furthermore, redundant descriptions are omitted for portions that fulfill the same functions as in the above-described first embodiment.

The second embodiment of the manufacturing method forms the piezoelectric element 13 rather than the elastic body 12 by the metal injection molding process as in the first embodiment of the manufacturing method. The elastic body 12 employs a pre-existing item.

The second embodiment of the manufacturing method includes a elastic body manufacturing step #600, a piezoelectric element manufacturing step #500, the retention step #300, and the post-retention step #400.

The elastic body manufacturing step #600 is provided with a preparation step #601 of preparing a pre-existing elastic body. In the preparation step #601, the elastic body 12 is disposed in the elastic body die 12A (see FIG. 9, S201), and the piezoelectric element die 13A is disposed at the elastic body die 12A (see FIG. 9, S202).

As shown in FIG. 5, the piezoelectric element manufacturing step #500 is provided with a material checking step #501, a binder mixing step #502, a pelletization step #503 and an injection molding step #504. Specific details of each step are the same as in the elastic body manufacturing step #200 of the first embodiment (#200 to #204; see FIG. 1), with the material used being changed from SUS304 to PZT. In the injection molding step #504, a powder material 131 (13) is injected into the piezoelectric element die 13A, and the piezoelectric element 13 is formed at the surface of the elastic body 12 (see FIG. 9, S203).

The retention step #300 and the post-retention step #400 (4401 to #403) are steps the same as in the first embodiment. In the retention step #300, pressure force is applied between the elastic body die 12A and the piezoelectric element die 13A so as to pressurize the elastic body 12 and the piezoelectric element 13 (see FIG. 9, S204). Furthermore, at the time of injection, if the elastic body 12 and the piezoelectric element 13 are sufficiently pressurized, the injection molding step #504 may be combined with this step. Thus, this step may be omitted. In the thermal sintering step #401, the elastic body 12 and the piezoelectric element 13 are removed from the elastic body die 12A and the piezoelectric element die 13A, the piezoelectric element 13 is heated and sintered, and the elastic body 12 and piezoelectric element 13 are bonded (see FIG. 9, S205).

The piezoelectric element 13 has a poor yield in cases of mechanical processing, because of the characteristics of the material such as susceptibility to cracking.

In contrast, according to the second embodiment of the manufacturing method, the piezoelectric element 13 may be fabricated by the metal injection molding process, integrated with the elastic body 12 during the injection molding, and perfectly bonded with the elastic body 12 during the thermal sintering. Thus, mechanical processing of the piezoelectric element 13 is unnecessary, and the yield may be improved.

Third Embodiment

Figure 6:
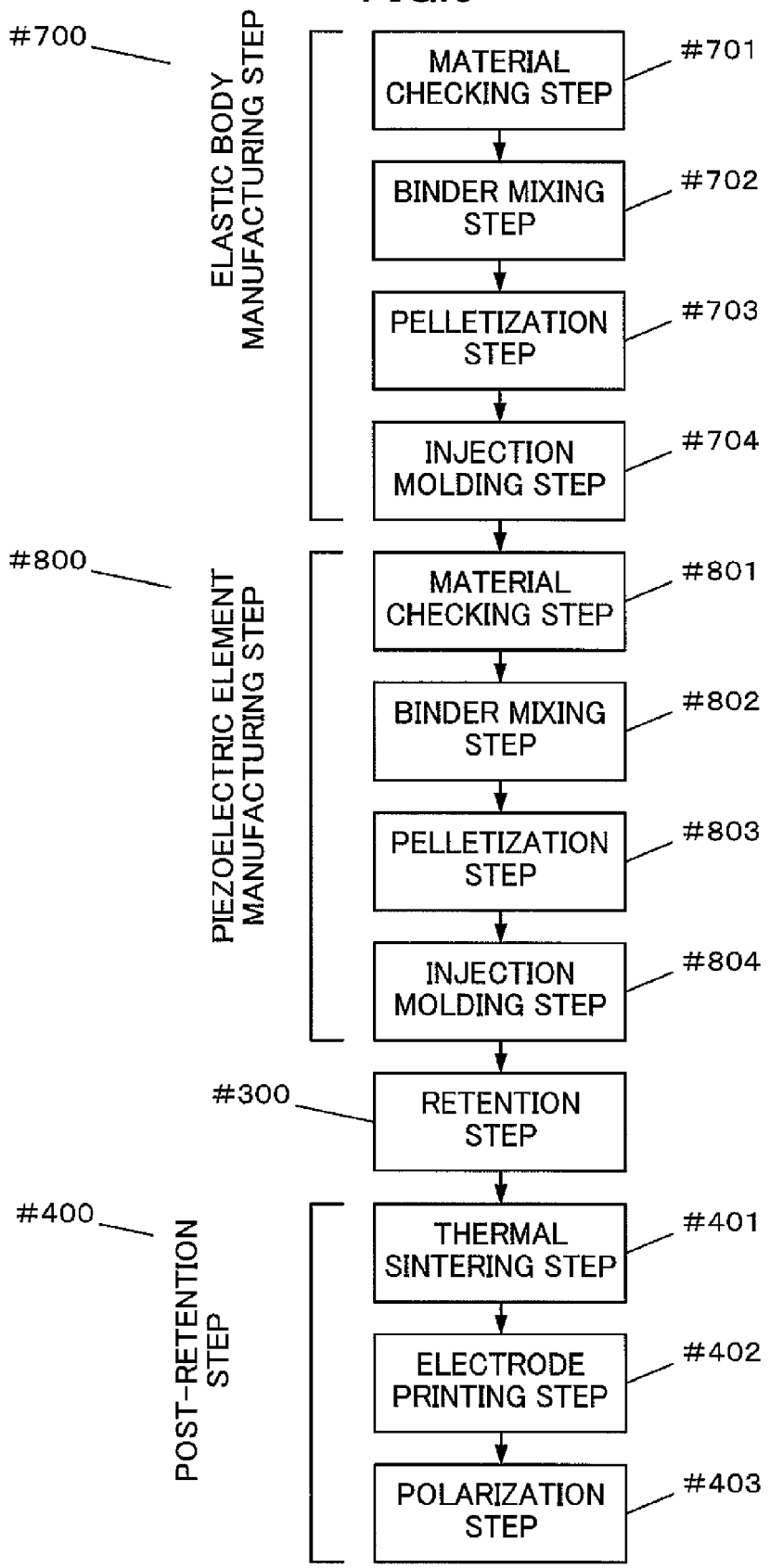
FIG. 6 is a process diagram showing the vibrating element manufacturing method according to a third embodiment.
Figure 10:
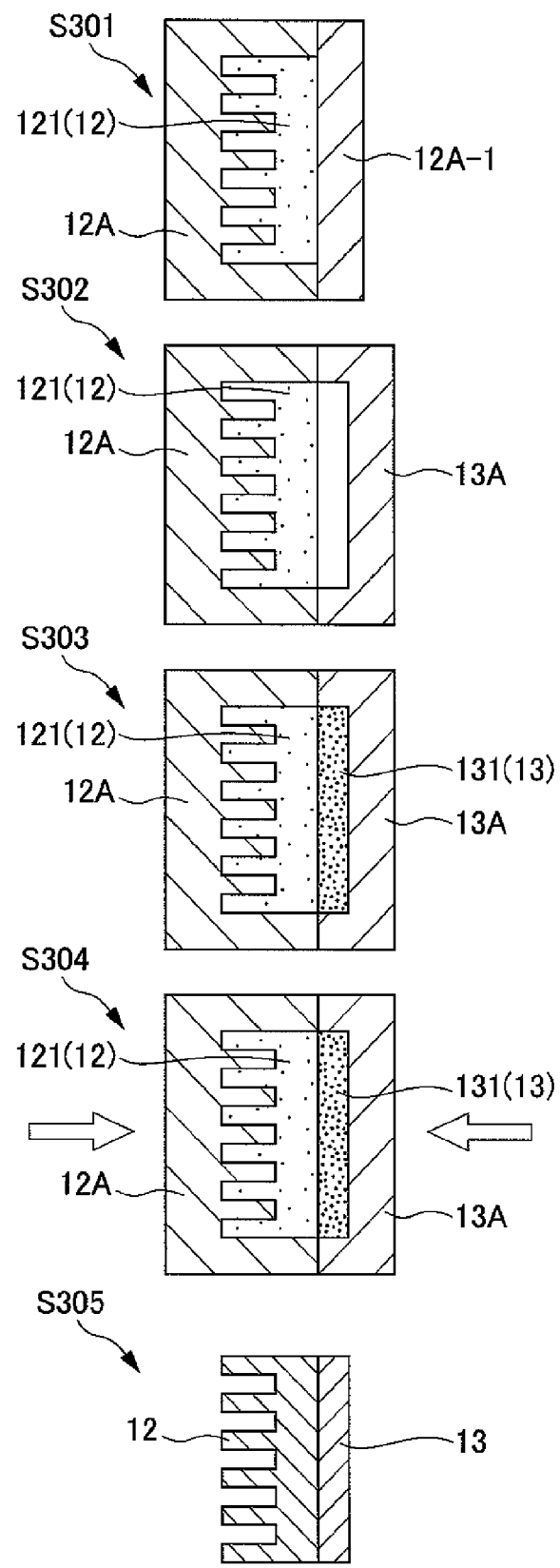
FIG. 10 is a schematic diagram showing the vibrating element manufacturing method according to the third embodiment.

FIG. 6 is a process diagram showing the vibrating element manufacturing method according to a third embodiment, and FIG. 10 is a schematic diagram showing the vibrating element manufacturing method according to the third embodiment.

The third embodiment of the manufacturing method is a method in which both the elastic body 12 and the piezoelectric element 13 are manufactured by the metal injection molding process, and has a format in which the elastic body 12 is injected first.

The third embodiment of the manufacturing method includes a elastic body manufacturing step #700, a piezoelectric element manufacturing step #800, the retention step #300, and the post-retention step #400.

Specific details of each step are the same as steps of the first embodiment or the second embodiment (#700 is the same as #200 of FIG. 1 and #800 is the same as #500 of FIG. 5).

In the elastic body manufacturing step #700 and the piezoelectric element manufacturing step #800, a die is used and the elastic body 12 and the piezoelectric element 13 are formed.

First, the elastic body material is injected into the die and the elastic body is formed. Next, the molded elastic body is kept in the die, the piezoelectric element material is then injected into the die, and the piezoelectric element is formed. Then, by performance of the retention step #300 and the post-retention step #400, the two materials form the elastic body 12 and the piezoelectric element 13 in the form of a sintered body, and are perfectly bonded.

More specifically, first the powder material 121 (12) is injected into the elastic body die 12A and the elastic body 12 is formed (see FIG. 10, S301).

Next, a portion 12A-1 of the elastic body die 12A is removed, and the piezoelectric element die 13A is disposed at the elastic body die 12A (see FIG. 10, S302).

Thereafter, the powder material 131 (13) is injected into the piezoelectric element die 13A and the piezoelectric element 13 is formed at the surface of the elastic body 12 (see FIG. 10, S303).

Then, in the retention step #300, pressure force is applied between the elastic body die 12A and the piezoelectric element die 13A so as to pressurize the elastic body 12 and the piezoelectric element 13 (see FIG. 10, S304). Furthermore, at the time of injection, if the elastic body 12 and the piezoelectric element 13 are sufficiently pressurized, the injection molding step #804 may be combined with this step. Thus, this step may be omitted.

Finally, the elastic body 12 and the piezoelectric element 13 are removed from the elastic body die 12A and the piezoelectric element die 13A, the elastic body 12 and the piezoelectric element 13 are heated and sintered, and the elastic body 12 and piezoelectric element 13 are bonded (see FIG. 10, S305).

Thus, according to the third embodiment of the manufacturing method, the elastic body 12 and the piezoelectric element 13 are integrally molded in the die by the metal injection molding process, the center of the elastic body 12 and the center of the piezoelectric element 13 are not misaligned, and the vibrating element 11 may be manufactured to be perfectly concentric.

Furthermore, because the elastic body 12 and the piezoelectric element 13 are integrally molded in the die, the outer diameter of the piezoelectric element 13 does not protrude outward beyond the outer diameter of the elastic body 12, and the yield may be improved without problems such as cracks forming in subsequent steps and the like occurring.

Moreover, if the vibrating element manufactured by the third embodiment of the manufacturing method is assembled into an ultrasonic motor, motor functions may be made more stable, and if this ultrasonic motor is assembled into a lens barrel or camera system, functionality and endurance may be further improved.

Fourth Embodiment

Figure 11:
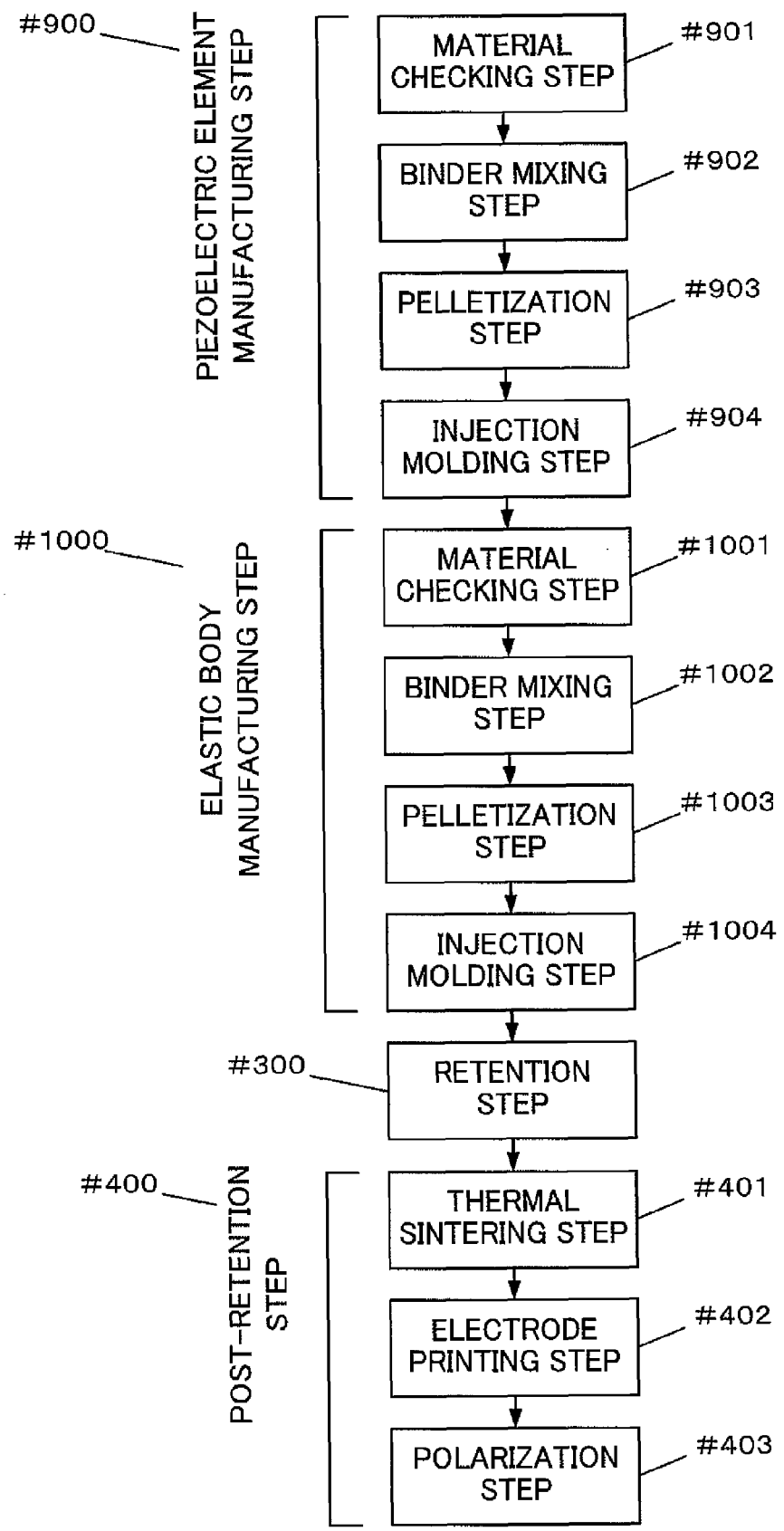
FIG. 11 is a process diagram showing the vibrating element manufacturing method according to a fourth embodiment.
Figure 12:
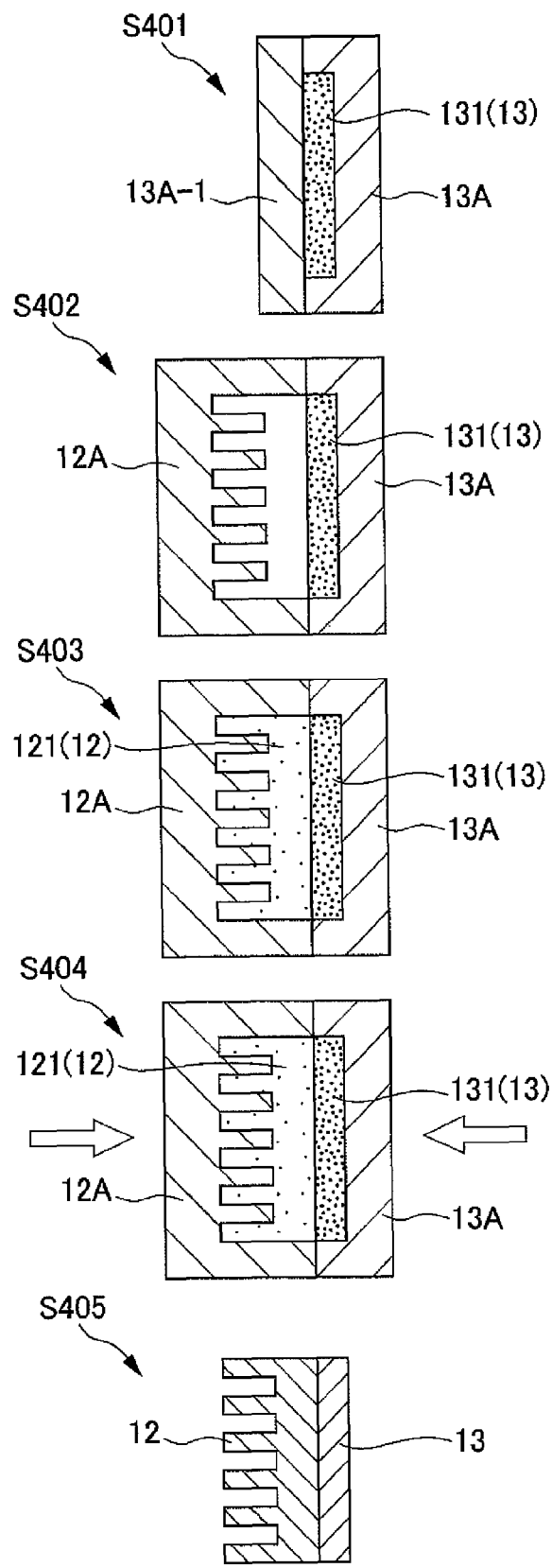
FIG. 12 is a schematic diagram showing the vibrating element manufacturing method according to the fourth embodiment.

FIG. 11 is a process diagram showing the vibrating element manufacturing method according to a fourth embodiment, and FIG. 12 is a schematic diagram showing the vibrating element manufacturing method according to the fourth embodiment.

The fourth embodiment of the manufacturing method is a method in which both the elastic body 12 and the piezoelectric element 13 are manufactured by the metal injection molding process, and has a format in which the piezoelectric element 13 is injected first.

The fourth embodiment of the manufacturing method including a piezoelectric element manufacturing step #900, a elastic body manufacturing step #1000, the retention step #300, and the post-retention step #400.

Specific details of each step are the same as steps of the first embodiment or the second embodiment (#900 is the same as #500 of FIG. 5 and #1000 is the same as #200 of FIG. 1).

In the piezoelectric element manufacturing step #900 and the elastic body manufacturing step #1000, a die is used and the elastic body 12 and the piezoelectric element 13 are formed.

First, the piezoelectric element material is injected into the die and the piezoelectric element is formed. Next, the molded piezoelectric element is kept in the die, the elastic body material is then injected into the die, and the elastic body is formed. Then, the integrated elastic body and piezoelectric element are removed and, by performance of the retention step #300 and the post-retention step #400, the two materials form the elastic body 12 and the piezoelectric element 13 in the form of a sintered body, and are perfectly bonded.

More specifically, first the powder material 131 (13) is injected into the piezoelectric element die 13A, and the piezoelectric element 13 is formed (see FIG. 12, S401).

Then, a portion 13A-1 of the piezoelectric element die 13A is removed, and the elastic body die 12A is disposed at the piezoelectric element die 13A (see FIG. 10, S402).

Thereafter, the powder material 121 (12) is injected into the elastic body die 12A, and the elastic body 12 is formed at the surface of the piezoelectric element 13 (see FIG. 12, S403).

Then, in the retention step #300, pressure force is applied between the elastic body die 12A and the piezoelectric element die 13A so as to pressurize the elastic body 12 and the piezoelectric element 13 (see FIG. 12, S404). Furthermore, at the time of injection, if the elastic body 12 and the piezoelectric element 13 are sufficiently pressurized, the injection molding step #1004 may be combined with this step. Thus, this step may be omitted.

Finally, the elastic body 12 and the piezoelectric element 13 are removed from the elastic body die 12A and the piezoelectric element die 13A, the elastic body 12 and the piezoelectric element 13 are heated and sintered, and the elastic body 12 and piezoelectric element 13 are bonded (see FIG. 12, S405).

Thus, according to the fourth embodiment of the manufacturing method, the elastic body 12 and the piezoelectric element 13 are integrally molded in the die by the metal injection molding process, the center of the elastic body 12 and the center of the piezoelectric element 13 are not misaligned, and the vibrating element 11 may be manufactured to be perfectly concentric.

Furthermore, because the elastic body 12 and the piezoelectric element 13 are integrally molded in the die, the outer diameter of the piezoelectric element 13 does not protrude outward beyond the outer diameter of the elastic body 12, and the yield may be improved without problems such as cracks forming in subsequent steps and the like occurring.

Moreover, if the vibrating element manufactured by the fourth embodiment of the manufacturing method is assembled into an ultrasonic motor, motor functions may be made more stable, and if this ultrasonic motor is assembled into a lens barrel or camera system, functionality and endurance may be further improved.

Fifth Embodiment

Figure 13:
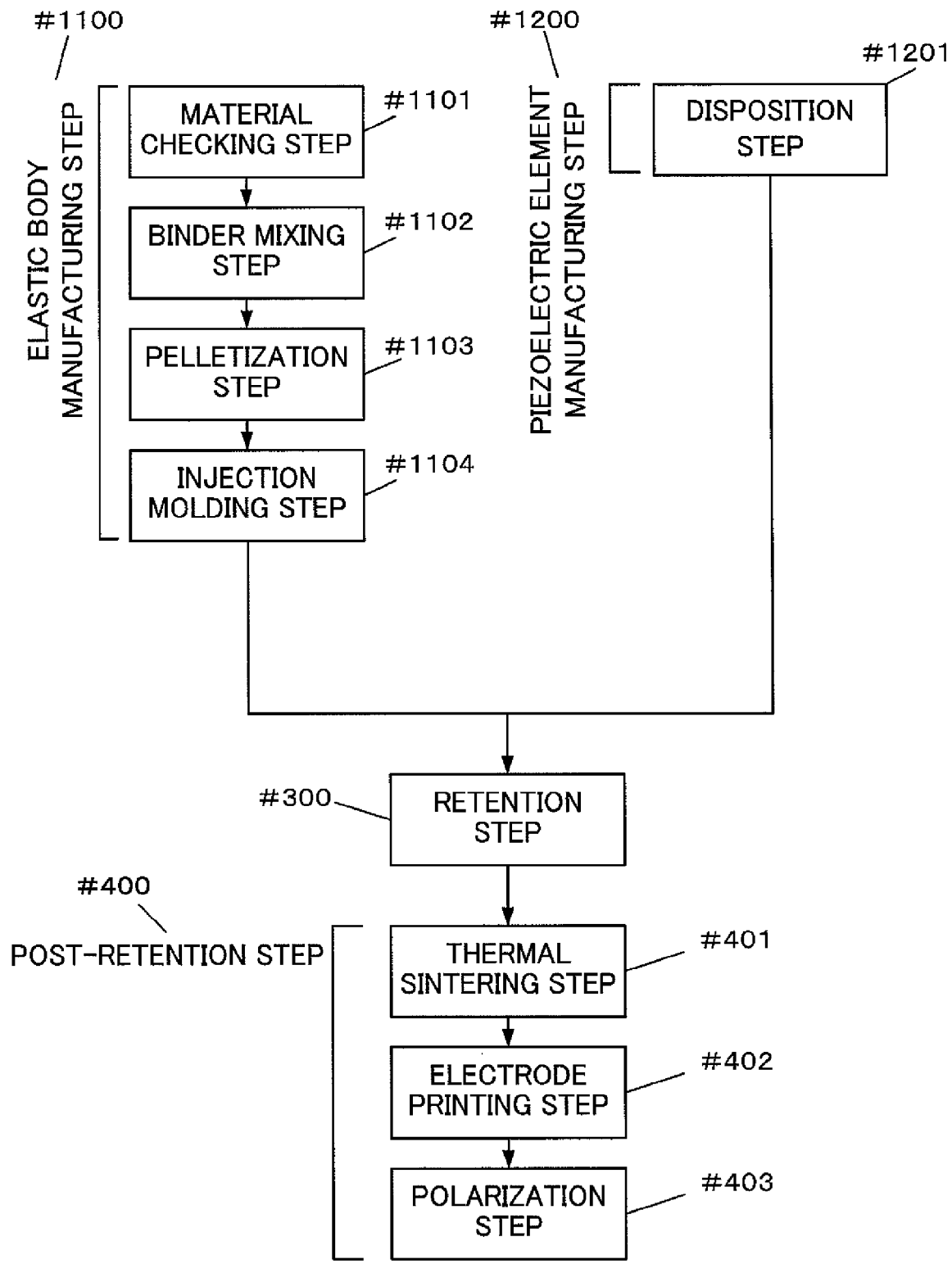
FIG. 13 is a process diagram showing the vibrating element manufacturing method according to a fifth embodiment.
Figure 14:
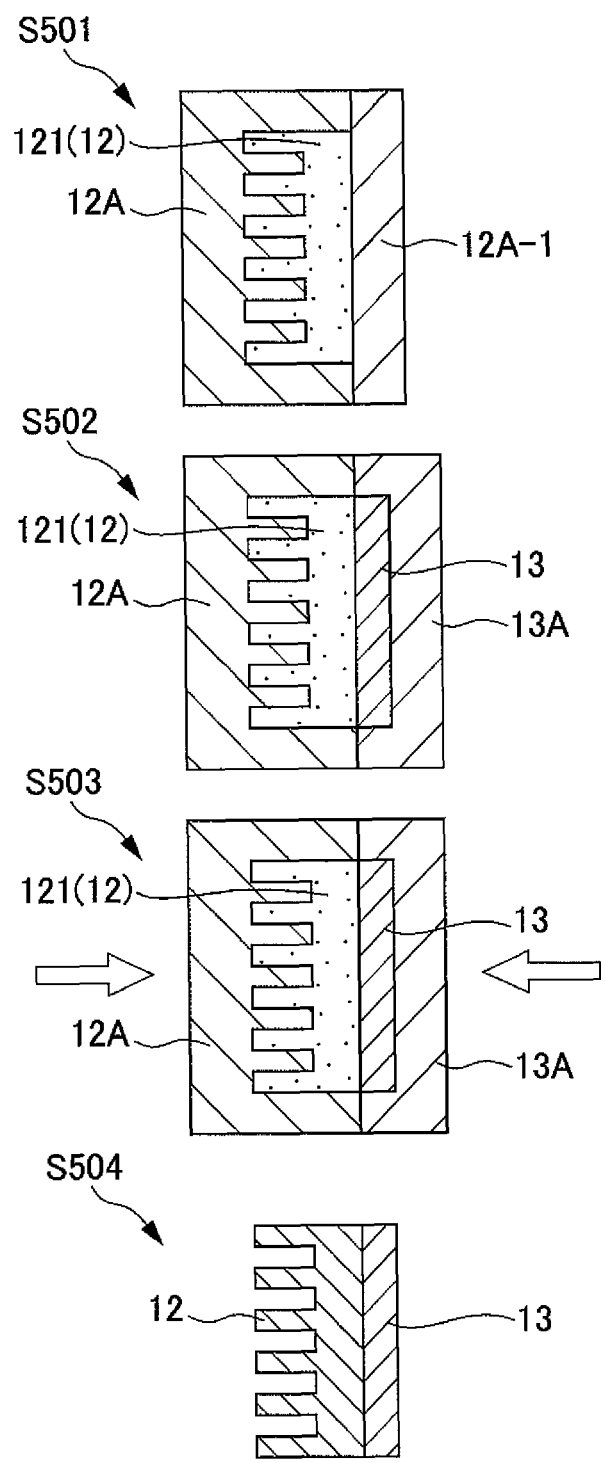
FIG. 14 is a schematic diagram showing the vibrating element manufacturing method according to the fifth embodiment.

FIG. 13 is a process diagram showing the vibrating element manufacturing method according to a fifth embodiment, and FIG. 14 is a schematic diagram showing the vibrating element manufacturing method according to the fifth embodiment.

The fifth embodiment of the manufacturing method is a method in which the elastic body 12 is manufactured by the metal injection molding process.

The fifth embodiment of the manufacturing method is provided with a elastic body manufacturing step #1100, a piezoelectric element manufacturing step #1200, the retention step #300, and the post-retention step #400.

The elastic body manufacturing step #1100 is provided with a material checking step #1101, a binder mixing step #1102, a pelletization step #1103 and an injection molding step #1104. Specific details of each step are the same as in the elastic body manufacturing step #200 of the first embodiment (#200 to #204; see FIG. 1). In the injection molding step #1104, the powder material 121 (12) is injected into the elastic body die 12A and the elastic body 12 is formed (see FIG. 14, S501).

The piezoelectric element manufacturing step #1200 is provided with a disposition step #1201 of disposing the pre-existing piezoelectric element. In the disposition step #1201, the portion 12A-1 of the elastic body die 12A is removed, and the piezoelectric element die 13A, in which the piezoelectric element 13 is disposed, is disposed at the surface of the elastic body 12 in the elastic body die 12A (see FIG. 14, S502).

The retention step #300 and the post-retention step #400 (#401 to #403) are steps the same as in the first embodiment. In the retention step #300, pressure force is applied between the elastic body die 12A and the piezoelectric element die 13A so as to pressurize the elastic body 12 and the piezoelectric element 13 (see FIG. 14, S503). In the thermal sintering step #401, the elastic body 12 and the piezoelectric element 13 are removed from the elastic body die 12A and the piezoelectric element die 13A, the elastic body 12 is heated and sintered, and the elastic body 12 and piezoelectric element 13 are bonded (see FIG. 14, S504).

Thus, according to the fifth embodiment of the manufacturing method, the elastic body 12 is fabricated by the metal injection molding process and is bonded to the piezoelectric element 13 during the thermal sintering. Thus, the conventional adhesion step can be discarded, and a great reduction in assembly duration and stabilization of product quality may be achieved.

Sixth Embodiment

Figure 15:
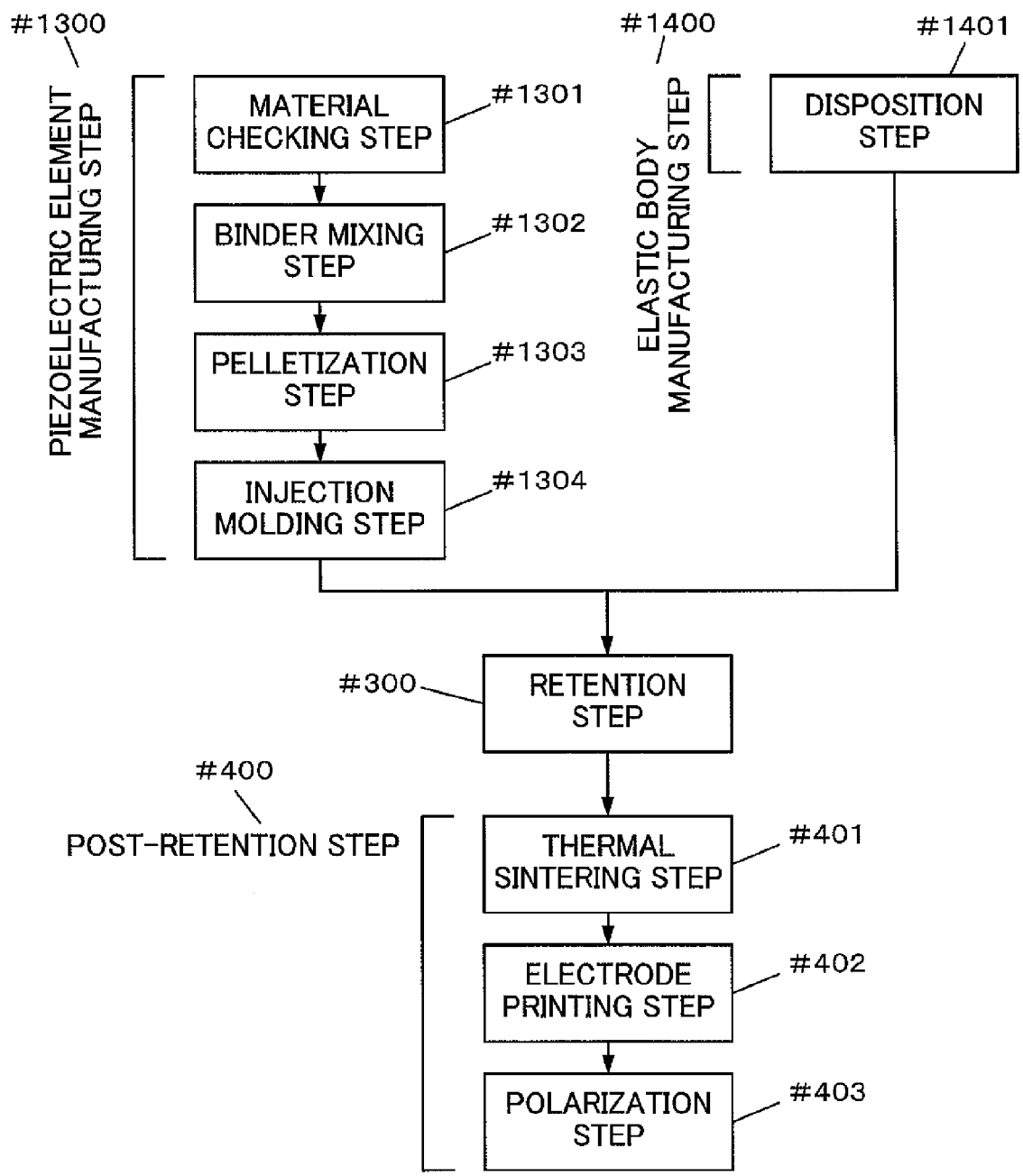
FIG. 15 is a process diagram showing the vibrating element manufacturing method according to a sixth embodiment.
Figure 16:
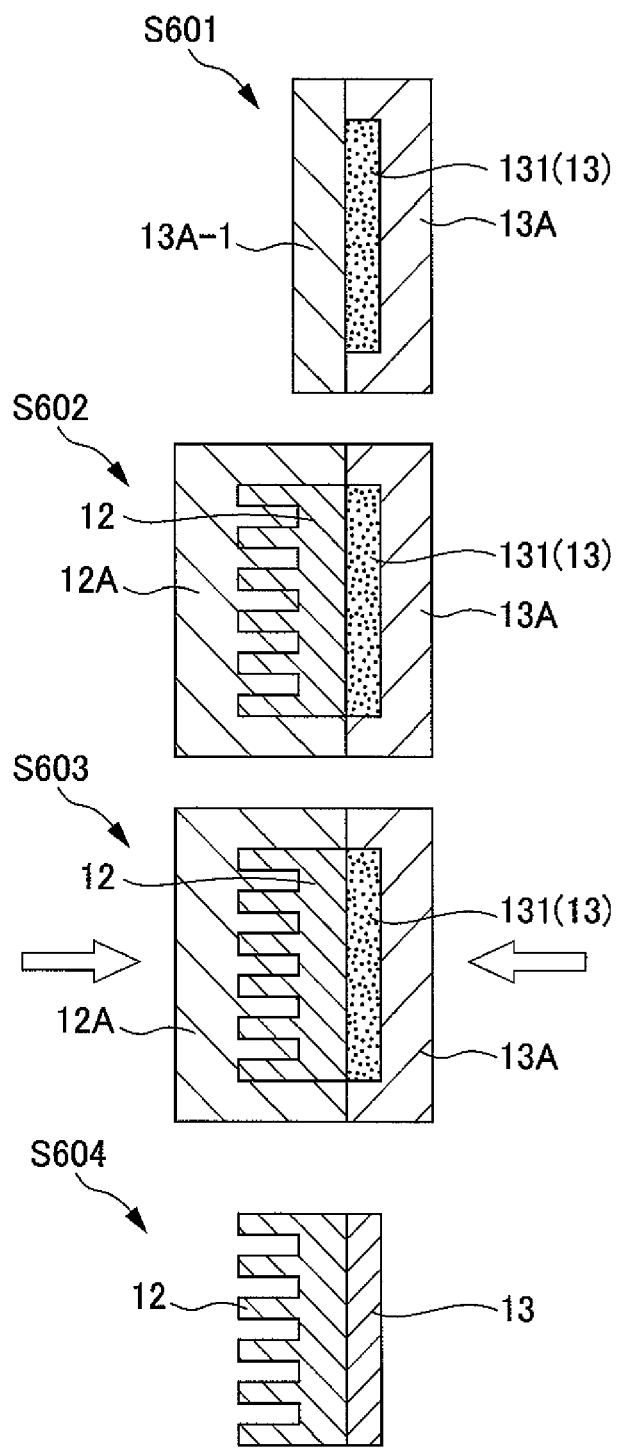
FIG. 16 is a schematic diagram showing the vibrating element manufacturing method according to the sixth embodiment.

FIG. 15 is a process diagram showing the vibrating element manufacturing method according to a sixth embodiment, and FIG. 16 is a schematic diagram showing the vibrating element manufacturing method according to the sixth embodiment.

The sixth embodiment of the manufacturing method is a method in which the piezoelectric element 13 is manufactured by the metal injection molding process and is thereafter bonded to the pre-existing elastic body 12.

The sixth embodiment of the manufacturing method includes a piezoelectric element manufacturing step #1300, a elastic body manufacturing step #1400, the retention step #300, and the post-retention step #400.

The piezoelectric element manufacturing step #1300 is provided with a material checking step #1301, a binder mixing step #1302, a pelletization step #1303 and an injection molding step #1304. Specific details of each step are the same as in the piezoelectric element manufacturing step #500 of the second embodiment (#501 to #504; see FIG. 5). In the injection molding step #1304, the powder material 131 (13) is injected into the piezoelectric element die 13A and the piezoelectric element 13 is formed (see FIG. 16, S601).

The elastic body manufacturing step #1400 is provided with a disposition step #1401 of disposing the pre-existing elastic body. In the disposition step #1401, the portion 13A-1 of the elastic body die 13A is removed, and the elastic body die 12A, in which the elastic body 12 is disposed, is disposed at the surface of the piezoelectric element 13 in the piezoelectric element die 13A (see FIG. 16, S602).

The retention step #300 and the post-retention step #400 (#401 to #403) are steps the same as in the first embodiment. In the retention step #300, pressure force is applied between the elastic body die 12A and the piezoelectric element die 13A so as to pressurize the elastic body 12 and the piezoelectric element 13 (see FIG. 16, S603). In the thermal sintering step #401, the elastic body 12 and the piezoelectric element 13 are removed from the elastic body die 12A and the piezoelectric element die 13A, the piezoelectric element 13 is heated and sintered, and the elastic body 12 and piezoelectric element 13 are bonded (see FIG. 16, S604).

In this way, according to the sixth embodiment of the manufacturing method, the piezoelectric element 13 is fabricated by the metal injection molding process and is bonded with the elastic body 12 during the thermal sintering. Thus, the conventional adhesion step can be eliminated, and a great reduction in assembly time and a stabilization of product quality may be achieved.

(Modified Embodiments)

For the embodiments described above, the following variations are possible.

Figure 7:
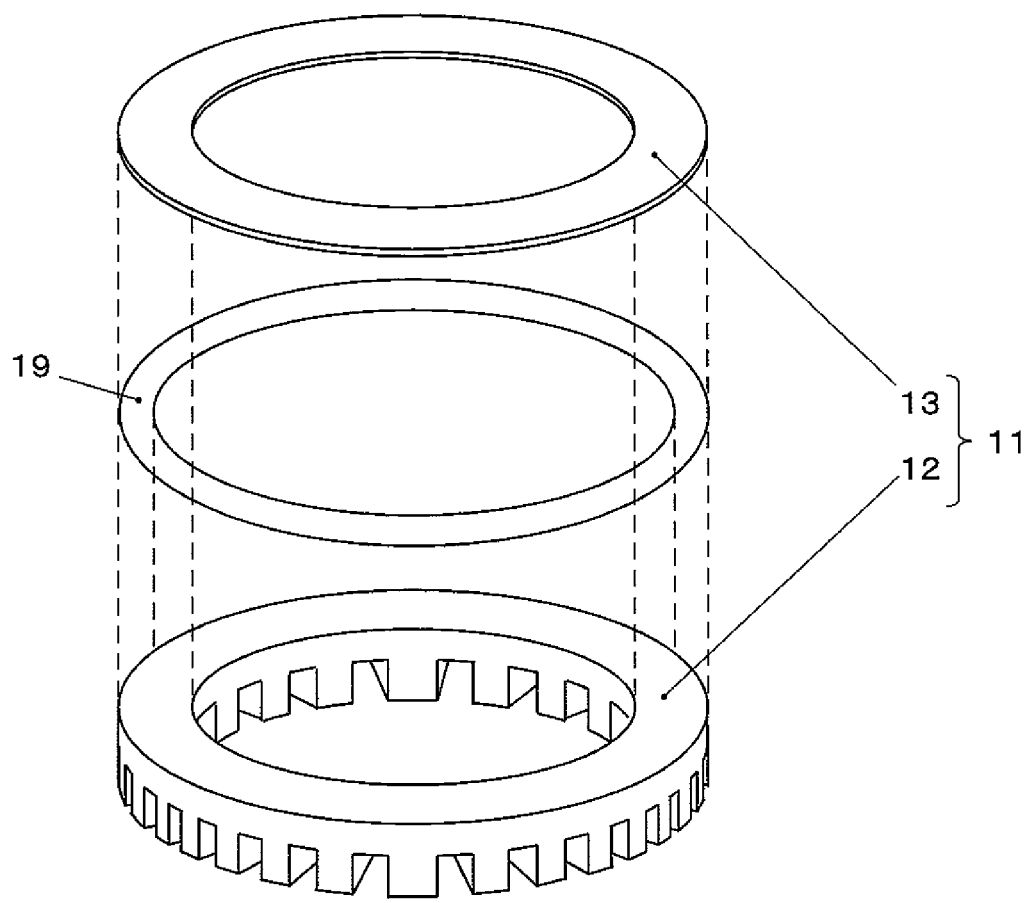
FIG. 7 is a diagram showing a modified embodiment of the vibrating element.

(1) FIG. 7 is a diagram showing a modified embodiment of the vibrating element. A reinforcement addition step, of adding a reinforcement that strengthens the bonding force between the elastic body 12 and the piezoelectric element 13, may be provided in the steps of the manufacturing method of the vibrating element 11. In the embodiments described above, the bonding of the elastic body 12 and the piezoelectric element 13 is bonding by anchor effect alone. However, in a case where further strengthening of the bonding force is required, a heat-curable reinforcement sheet 19, which serves as the reinforcement, is first stuck onto the elastic body 12 or piezoelectric element 13, thereby enabling strengthening at the same time as the sintering. Instead of the reinforcement sheet 19, a sheet including a sintering assistant such as boron oxide ($B_2O_3$), alumina ($Al_2O_3$) or the like may be stuck thereon.

(2) Examples have been described in which the elastic body and/or piezoelectric element is formed by the metal injection molding process. However, each may also be formed by applying pressure to a mixture of the material of the elastic body or piezoelectric element with a binder.

(3) An example has been described in which the vibrating actuator is used as a drive source for autofocusing. However, the vibrating actuator may be employed in the drive source of a blur-correcting mechanism that drives a portion of the imaging system in a camera system and corrects blurring caused by hand movement, the driving section of a photocopier, a steering wheel-tilting apparatus in a vehicle, the driving apparatus of a watch, or the like.

(4) An example has been described in which the vibrating actuator is an annular actuator. However, the vibrating actuator may be, for example, a rod-shaped actuator, a pencil-shaped actuator, a dish-shaped actuator or the like.

The above-described embodiments and modified embodiments may be suitably combined and used, but detailed descriptions are not provided herein. The present invention is not to be limited by the above described embodiments.

The invention claimed is:

1. A vibrating element manufacturing method comprising:
a first step of disposing an electro-mechanical conversion element in a retaining member;
a second step of forming a elastic body at a surface of the electro-mechanical conversion element by injection molding;
a third step of heating and sintering the elastic body such that the elastic body is bonded with the electro-mechanical conversion element as a result of the heating and sintering; and
a fourth step of forming an electrode at the electro-mechanical conversion element.

2. A vibrating element manufacturing method comprising:
a first step of disposing an electro-mechanical conversion element in a first die;
a second step of disposing a second die at the first die;
a third step of injecting a powder material into the second die and forming a elastic body at a surface of the electro-mechanical conversion element;
a fourth step of removing the elastic body and the electro-mechanical conversion element from the first die and the second die, and heating and sintering the elastic body such that the elastic body is bonded with the electro-mechanical conversion element as a result of the heating and sintering; and
a fifth step of forming an electrode at the electro-mechanical conversion element.

3. A vibrating element manufacturing method of manufacturing a vibrating element provided with a elastic body and an electro-mechanical conversion element, which comprises:
a retention step of integrating and retaining the elastic body and the electro-mechanical conversion element;
a thermal sintering step of heating and sintering the elastic body and the electro-mechanical conversion element retained by the retention step such that the elastic body is bonded with the electro-mechanical conversion element as a result of the heating and sintering; and
an electrode formation step of forming an electrode at the electro-mechanical conversion element.

4. The vibrating element manufacturing method according to claim 3, further comprising a molding step of molding at least one of the elastic body and the electro-mechanical conversion element.

5. The vibrating element manufacturing method according to claim 3, further comprising a combteeth formation step of forming combteeth at the elastic body.

6. The vibrating element manufacturing method according to claim 3, further comprising a reinforcement application step of applying a reinforcement that strengthens a bonding force between the elastic body and the electro-mechanical conversion element.

7. The vibrating element manufacturing method according to claim 3, wherein a sintering temperature of the thermal sintering step is 1000 to 1200° C.

8. A vibrating element manufacturing method of manufacturing a vibrating element provided with a elastic body and an electro-mechanical conversion element, the vibrating element manufacturing method comprising:
a retention step of integrating and retaining the elastic body and the electro-mechanical conversion element;
a thermal sintering step of heating and sintering the elastic body and the electro-mechanical conversion element retained by the retention step such that the elastic body is bonded with the electro-mechanical conversion element as a result of the heating and sintering; and
a polarization step of polarizing the electro-mechanical conversion element.

9. A vibrating element manufacturing method comprising:
a first step of disposing an electro-mechanical conversion element in a retaining member;
a second step of forming a elastic body at a surface of the electro-mechanical conversion element by injection molding;
a third step of heating and sintering the elastic body such that the elastic body is bonded with the electro-mechanical conversion element as a result of the heating and sintering; and
a fourth step of polarizing the electro-mechanical conversion element.

10. A vibrating element manufacturing method comprising:
- a first step of disposing an electro-mechanical conversion element in a first die;
- a second step of disposing a second die at the first die;
- a third step of injecting a powder material into the second die and forming a elastic body at a surface of the electro-mechanical conversion element;
- a fourth step of removing the elastic body and the electro-mechanical conversion element from the first die and the second die, and heating and sintering the elastic body such that the elastic body is bonded with the electro-mechanical conversion element as a result of the heating and sintering; and
- a fifth step of polarizing the electro-mechanical conversion element.

* * * * *